US009564394B1

(12) United States Patent
Roth et al.

(10) Patent No.: US 9,564,394 B1
(45) Date of Patent: Feb. 7, 2017

(54) METHODS AND APPARATUS FOR REDUCING SPATIAL OVERLAP BETWEEN ROUTING WIRES

(71) Applicant: Altera Corporation, San Jose, CA (US)

(72) Inventors: Aron Joseph Roth, North York (CA); Jeffrey Christopher Chromczak, Toronto (CA); Michael Chan, Scarborough (CA)

(73) Assignee: Altera Corporation, San Jose, CA (US)

( * ) Notice: Subject to any disclaimer, the term of this patent is extended or adjusted under 35 U.S.C. 154(b) by 24 days.

(21) Appl. No.: 14/546,320

(22) Filed: Nov. 18, 2014

(51) Int. Cl.
*G06F 17/50* (2006.01)
*H01L 23/522* (2006.01)
*H01L 21/768* (2006.01)

(52) U.S. Cl.
CPC ....... *H01L 23/5221* (2013.01); *G06F 17/5077* (2013.01); *H01L 21/768* (2013.01); *H01L 23/5226* (2013.01)

(58) Field of Classification Search
CPC ............... H01L 23/5221; H01L 21/768; H01L 23/5226; G06F 17/5077
See application file for complete search history.

(56) References Cited

U.S. PATENT DOCUMENTS

| 5,073,729 A | 12/1991 | Greene et al. |
| 5,594,363 A | 1/1997 | Freeman et al. |
| 5,777,887 A | 7/1998 | Marple et al. |
| 5,818,730 A | 10/1998 | Young |
| 6,163,167 A | 12/2000 | Young |
| 6,242,947 B1 | 6/2001 | Trimberger |
| 6,477,693 B1 * | 11/2002 | Marchenko ......... G06F 17/5077 716/130 |
| 6,501,297 B1 | 12/2002 | Kong |
| 7,279,929 B1 | 10/2007 | Young |
| 7,557,611 B2 | 7/2009 | Kaptanoglu |
| 7,784,010 B1 | 8/2010 | Balsdon et al. |
| 8,458,640 B2 | 6/2013 | Gao |
| 8,490,042 B2 | 7/2013 | Gao |
| 2004/0178821 A1 | 9/2004 | Bal et al. |
| 2005/0151258 A1 * | 7/2005 | Kotecha ............... G06F 17/5077 257/758 |
| 2007/0028201 A1 * | 2/2007 | Mehrotra ............ G06F 17/5077 716/129 |

(Continued)

*Primary Examiner* — Nha Nguyen
(74) *Attorney, Agent, or Firm* — Jason Tsai (57) ABSTRACT

An integrated circuit may have interconnect circuitry which may include a sequence of tiles. Each tile may include a predetermined routing of multiple wires on multiple tracks. Wires may change tracks within a tile through wire twisting or through via connections and wires in another metal layer. Wires that change tracks may reduce the overlap between pairs of adjacent wires, thereby reducing the coupling capacitance between the respective wires. Reducing the coupling capacitance may result in reduced crosstalk between the wires which may speed up the signal transition along those wires compared to the signal transition in conventional interconnect circuitry. At the same time, suboptimal wire stitching in a routing tile that connects a wire that ends in the next routing tile to a wire that starts in the routing tile, whereby the two wires overlap each other may enable beneficial crosstalk, which may further improve signal transition time.

22 Claims, 8 Drawing Sheets

(56) References Cited

U.S. PATENT DOCUMENTS

| | | | |
|---|---|---|---|
| 2007/0136714 A1* | 6/2007 | Cohn | G06F 17/5077 716/54 |
| 2007/0256045 A1* | 11/2007 | Lin | G06F 17/5077 716/129 |
| 2009/0106531 A1 | 4/2009 | Kundu et al. | |

* cited by examiner

METHODS AND APPARATUS FOR REDUCING SPATIAL OVERLAP BETWEEN ROUTING WIRES

BACKGROUND

This invention relates to integrated circuits and, more particularly, to interconnect circuitry in integrated circuits.

Integrated circuits may include many components such as inputs, outputs, memory blocks, logic circuits, etc. Interconnect circuitry in the integrated circuit may route signals over wires among these components.

In an effort to ease chip design and to provide a simple and regular layout, many integrated circuits may include multiple instantiations of a same tile of interconnect circuitry, which may be repeated across the entire integrated circuit. Each tile of interconnect circuitry may include two or more parallel tracks. Each track is a lane that may route at most one wire in parallel.

A tile of interconnect circuitry often has at least one wire starting in a given track and at least one other wire ending in another track with all other wires changing tracks. The change in tracks (e.g., every wire may be shifted one track to the right) is sometimes also referred to as wire twisting.

A wire that spans L tiles overlaps a neighboring wire for L-1 tiles in such a configuration. As design geometries shrink, a reduction in the spacing between wires may result in increased interconnect capacitance, which may be further exacerbated by the long spatial overlap between the adjacent wires. Situations frequently arise where signal delays are affected by effects such as crosstalk in which a signal toggling in an aggressor wire slows down the signal transition in a victim wire.

SUMMARY

In accordance with certain embodiments, an integrated circuit may have interconnect circuitry which include a routing tile in a sequence of tiles. The routing tile may include first, second, and third wires in a first metal layer. The first, second, and third wires may have first, second, and third endpoints in first, second, and third tracks, respectively. The routing tile may further have a fourth wire in the first metal layer with a fourth endpoint in the first track and a connection from the third wire to the fourth wire through at least two via connections and a track in a second metal layer.

It is appreciated that the present invention can be implemented in numerous ways, such as a process, an apparatus, a system, a device, or a method on a computer readable medium. Several inventive embodiments of the present invention are described below.

In certain embodiments, the above-mentioned routing may include two additional tracks. A fifth wire in the first metal layer may be routed from the second track to the third track and from the third track to a fourth track, and a sixth wire in the first metal layer may be routed from the fourth track to a fifth track.

If desired, the routing tile may include seventh and eighth wires in the first metal layer that with fifth and sixth endpoints in the fifth and second tracks, respectively, and an additional connection from the seventh wire to the eighth wire through at least two additional via connections and an additional track in the second metal layer.

Further features of the invention, its nature and various advantages, will be more apparent from the accompanying drawings and the following detailed description of the embodiments.

DETAILED DESCRIPTION

The present invention relates to integrated circuits and, more particularly, to interconnect circuitry in integrated circuits.

Integrated circuits may include multiple instantiations of a same tile of interconnect circuitry (i.e., every instantiation of the interconnect circuitry tile has the exact same layout), which may be repeated across the entire integrated circuit. Each tile of interconnect circuitry may include two or more parallel tracks. Each track is a lane that may route at most one wire in parallel. Wires may start in a tile, end in a tile, start and end in a tile, or traverse a tile. Wires may also change tracks inside a tile. The change in tracks during which a wire is shifted from one track to another is sometimes also referred to as wire twisting.

As design geometries shrink, a reduction in the spacing between wires may result in increased interconnect capacitance and increased crosstalk, which may depend on the spatial overlap between adjacent wires. It may therefore be desirable to implement interconnect circuitry with short overlap between adjacent wires.

It will be recognized by one skilled in the art, that the present exemplary embodiments may be practiced without some or all of these specific details. In other instances, well-known operations have not been described in detail in order not to unnecessarily obscure the present embodiments.

Figure 1:
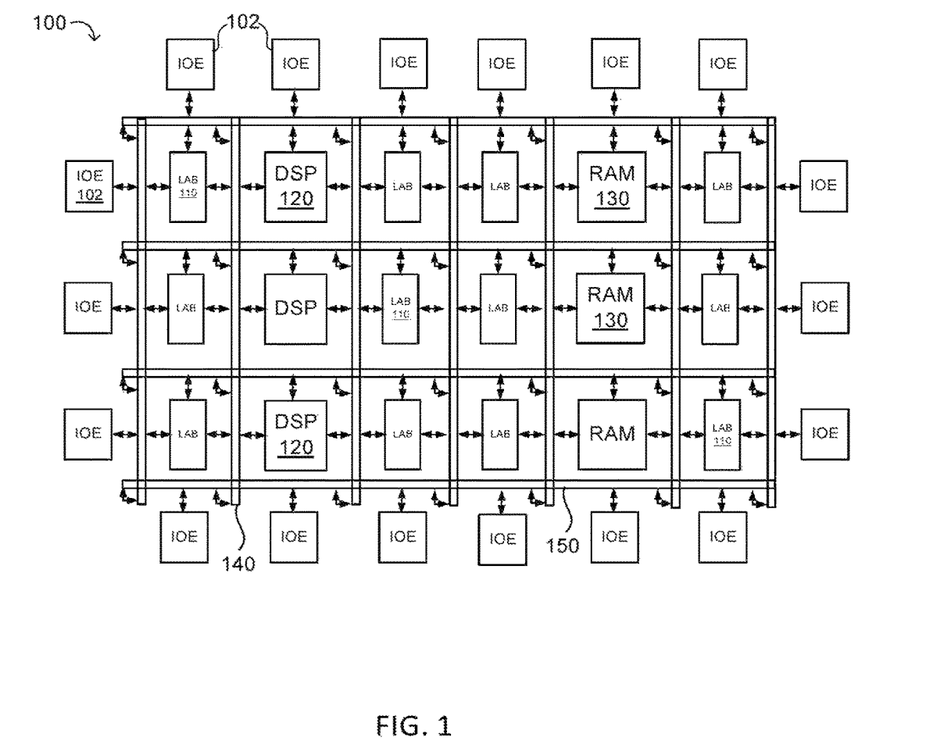
FIG. 1 is a diagram of an illustrative integrated circuit having an exemplary routing topology in accordance with an embodiment.

An illustrative embodiment of an integrated circuit such as programmable logic device (PLD) 100 having an exemplary interconnect circuitry is shown in FIG. 1. As shown in FIG. 1, the programmable logic device (PLD) may include a two-dimensional array of functional blocks, including logic array blocks (LABs) 110 and other functional blocks, such as random access memory (RAM) blocks 130 and digital signal processing (DSP) blocks 120, for example. Functional blocks such as LABs 110 may include smaller programmable regions (e.g., logic elements, configurable logic blocks, or adaptive logic modules) that receive input signals and perform custom functions on the input signals to produce output signals.

In addition, the programmable logic device may have input/output elements (IOEs) 102 for driving signals off of PLD 100 and for receiving signals from other devices. Input/output elements 102 may include parallel input/output circuitry, serial data transceiver circuitry, differential receiver and transmitter circuitry, or other circuitry used to connect one integrated circuit to another integrated circuit. As shown, input/output elements 102 may be located around the periphery of the chip. If desired, the programmable logic device may have input/output elements 102 arranged in different ways. For example, input/output elements 102 may form one or more columns of input/output elements that may be located anywhere on the programmable logic device (e.g., distributed evenly across the width of the PLD). If desired, input/output elements 102 may form one or more rows of input/output elements (e.g., distributed across the height of the PLD). Alternatively, input/output elements 102 may form islands of input/output elements that may be distributed over the surface of the PLD or clustered in selected areas.

The PLD may also include programmable interconnect circuitry in the form of vertical routing channels 140 (i.e., interconnects formed along a vertical axis of PLD 100) and horizontal routing channels 150 (i.e., interconnects formed along a horizontal axis of PLD 100), each routing channel including at least one track to route at least one wire.

Routing wires may be shorter than the entire length of the routing channel. A length L wire may span L functional blocks. For example, a length four wire may span four blocks. Length four wires in a horizontal routing channel may be referred to as "H4" wires, whereas length four wires in a vertical routing channel may be referred to as "V4" wires.

Different PLDs may have different functional blocks which connect to different numbers of routing channels. A three-sided routing architecture is depicted in FIG. 1 where input and output connections are present on three sides of each functional block to the routing channels. Other routing architectures are also intended to be included within the scope of the present invention. Examples of other routing architectures include 1-sided, 1½-sided, 2-sided, and 4-sided routing architectures.

In a direct drive routing architecture, each wire is driven at a single logical point by a driver. The driver may be associated with a multiplexer which selects a signal to drive on the wire. In the case of channels with a fixed number of wires along their length, a driver may be placed at each starting point of a wire.

Note that other routing topologies, besides the topology of the interconnect circuitry depicted in FIG. 1, are intended to be included within the scope of the present invention. For example, the routing topology may include wires that travel diagonally or that travel horizontally and vertically along different parts of their extent as well as wires that are perpendicular to the device plane in the case of three dimensional integrated circuits, and the driver of a wire may be located at a different point than one end of a wire. The routing topology may include global wires that span substantially all of PLD 100, fractional global wires such as wires that span part of PLD 100, staggered wires of a particular length, smaller local wires, or any other suitable interconnection resource arrangement.

Furthermore, it should be understood that embodiments of the present invention may be implemented in any integrated circuit. If desired, the functional blocks of such an integrated circuit may be arranged in more levels or layers in which multiple functional blocks are interconnected to form still larger blocks. Other device arrangements may use functional blocks that are not arranged in rows and columns.

Note that the routing channels in FIG. 1 and the functional blocks are all displayed in a single plane. In practice, an integrated circuit may have several layers. For example, the integrated circuit may have a functional layer (or several functional layers in the case of a three-dimensional (3-D) circuit implementation) in which the functional blocks (e.g., LABs 110, DSP blocks 120, and RAM blocks 130) are implemented. The routing channels (e.g., vertical routing channels 140 and horizontal routing channels 150) may cross above or below the functional blocks in multiple metal layers that are electrically isolated from the functional blocks and from each other by layers of isolating material such as a dielectric. Via connections may cross the layers of isolating materials to connect routing wires in different metal layers with each other or routing wires in metal layers with contacts in the functional layers.

Figure 2:
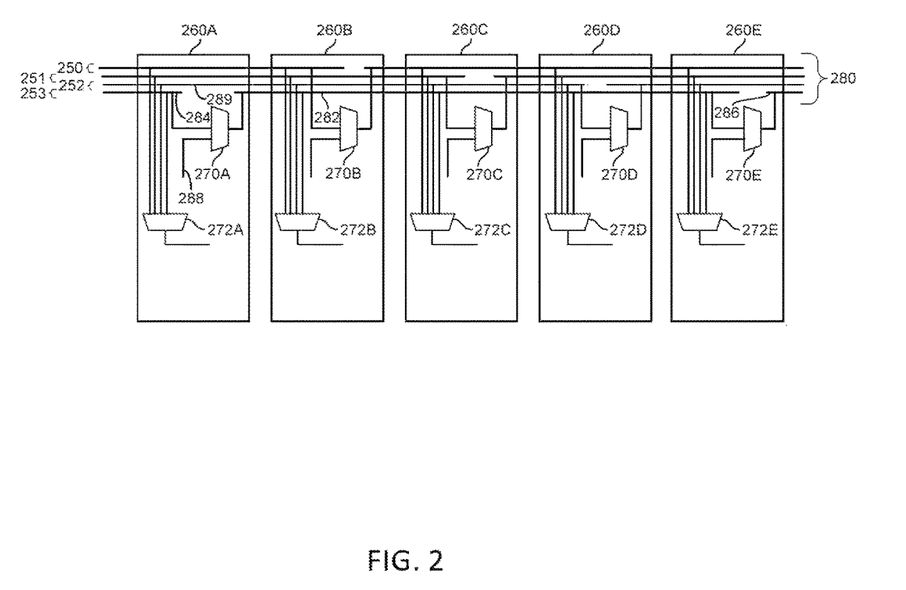
FIG. 2 is a diagram of an illustrative direct drive routing channel with staggered wires in accordance with an embodiment.

FIG. 2 shows a direct drive horizontal routing channel 280 including a single bundle of wires across functional blocks 260. Each functional block 260 may have a driver (not shown) to drive a signal on a wire that starts in the respective functional block (e.g., wire 286).

Each driver may be associated with a multiplexer such as multiplexer 270. For example, multiplexer 270E may be configured to select a signal to drive on wire 286, and multiplexer 270A may be configured to select a wire that ends in the respective functional block (e.g., wire 284). Connecting a wire that ends in a functional block to a wire that starts in that identical functional block is sometimes also referred to as "wire stitching" or stitching. If desired, tri-states may perform the wire stitching instead of multiplexers 270, which may result in a bi-directional routing channel 280. Alternatively, wires may perform the wire stitching. In other words, wires may directly connect to other wires to implement a long wire (not shown).

If desired, multiplexer 270E may be configured to select a signal from a different wire. For example, multiplexer 270E may select a signal from a wire driven by a block within functional block 260E. Multiplexer 270E may also select a signal from a wire in another routing channel such as a signal from a wire in a vertical routing channel that ends in the respective functional block (not shown).

Each functional block 260 may include one or more multiplexers 272 (e.g., multiplexer 272A in functional block 260A), which may be configured to route a wire of routing channel 280 to a block within the respective functional block 260.

As shown, each wire of routing channel 280 is unidirectional from left to right and has a length of four. In other words, a wire that starts in functional block 260A will end in the functional block 260E. If desired, routing channel 280 may be bi-directional (e.g., with tri-state buffers performing the wire stitching) or unidirectional from right to left (e.g., with multiplexers performing wire stitching in the opposite direction as shown in FIG. 2). If desired, the wires in routing channel 280 may have any length. For example, the wires may have a length of two which may require wire stitching in every other functional block 260.

Routing channel 280 as shown also has different wires that start and end in different functional blocks 260 and thus may be stitched in the respective functional block. For example, the wire in track 250 may be stitched in functional block 260B, the wire in track 251 may be stitched in functional block 260C, etc. An arrangement in which different wires from the same bundle of wires may be stitched together in different functional blocks is sometimes also referred to as staggered wiring or a routing channel with staggered wires. An arrangement in which staggered wires are stitched together in adjacent functional blocks is sometimes also referred to as single staggered wiring.

The single staggered wiring shown in FIG. 2 has the effect that any two adjacent wires in routing channel 280 overlap each other for approximately three functional blocks. For example, wire 289 overlaps wire 282 from functional block 260A in which wire 282 starts until functional block 260D in which wire 289 ends, which may result in crosstalk effects due to the capacitive coupling between the two wires.

If desired, the wires in routing channel 280 may be twisted (i.e., change tracks, which is not shown) to allow for a regular layout in which the respective multiplexer 270 always drives a wire in track 253 and always receives a wire from track 250 of routing channel 280. As an example, consider wire 282, which starts in functional block 260A. In functional block 260B, wire 282 may be twisted and pass from track 253 to track 252. Similarly, all neighboring wires may be twisted in the same direction to free track 252. Since wire 282 is now in track 252, a new wire may start in track 253 in functional block 260B. Subsequently, wire 282 may pass from track 252 to track 251 in functional block 260C, from track 251 to track 250 in functional block 260D, and end in track 250 in functional block 260E.

Figure 3:
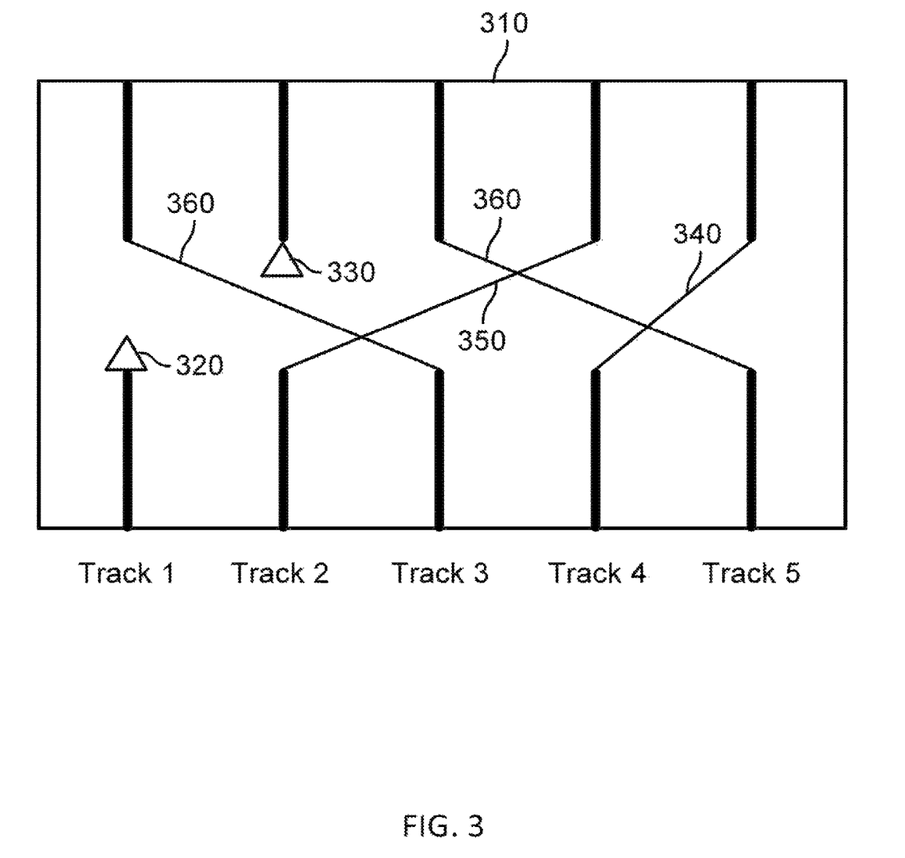
FIG. 3 is a diagram of an illustrative template for forming a routing tile with each pair of adjacent wires overlapping each other for at most one tile length when arranged in a sequence of routing tiles in accordance with an embodiment.

FIG. 3 shows an illustrative template for forming routing tiles such as routing tile 310 with wires arranged on tracks such that any pair of adjacent wires overlaps each other for at most one tile length when arranged in a sequence of routing tiles.

The limited spatial overlap between wires on adjacent tracks may help reduce undesirable capacitive coupling between wires and thus reduce negative effects caused by crosstalk in which signals toggling in an aggressor wire can slow down a victim wire's transition from one logic level (e.g., GND) to another logic level (e.g., VCC). However, when two wires on adjacent tracks transition in the same direction, the aggressor wire's transition may speed up the victim wire's transition, which is sometimes also referred to as beneficial crosstalk. If desired, routing tile 310 may enable beneficial crosstalk when stitching wires together sub-optimally (e.g., by stitching a wire to another wire before the wire ends).

As shown, routing tile 310 is unidirectional from the bottom to the top. Routing tile 310 may include a wire that starts in track Track2 and is driven by input driver 330 and a wire that ends in track Track1 and is coupled to output driver 320.

Wires that enter routing tile 310 on tracks with odd numbers and that don't end in that track (i.e., wires on Track3 and Track5, but not the wire on track Track1) exit routing tile 310 two tracks to the left. In ether words, the wire that enters routing tile 310 on track Track3 exits routing tile 310 on track Track1, and the wire that enters routing tile 310 on track Track5 exits routing tile 310 on track Track3.

Wires that enter routing tile 310 on tracks with even numbers except for the track with the highest even number (i.e., track Track2, but not track Track4 in FIG. 3) exit routing tile 310 two tracks to the right. In other words, the wire that enters routing tile 310 on track Track2 exits routing tile 310 on track Track4.

Figure 4:
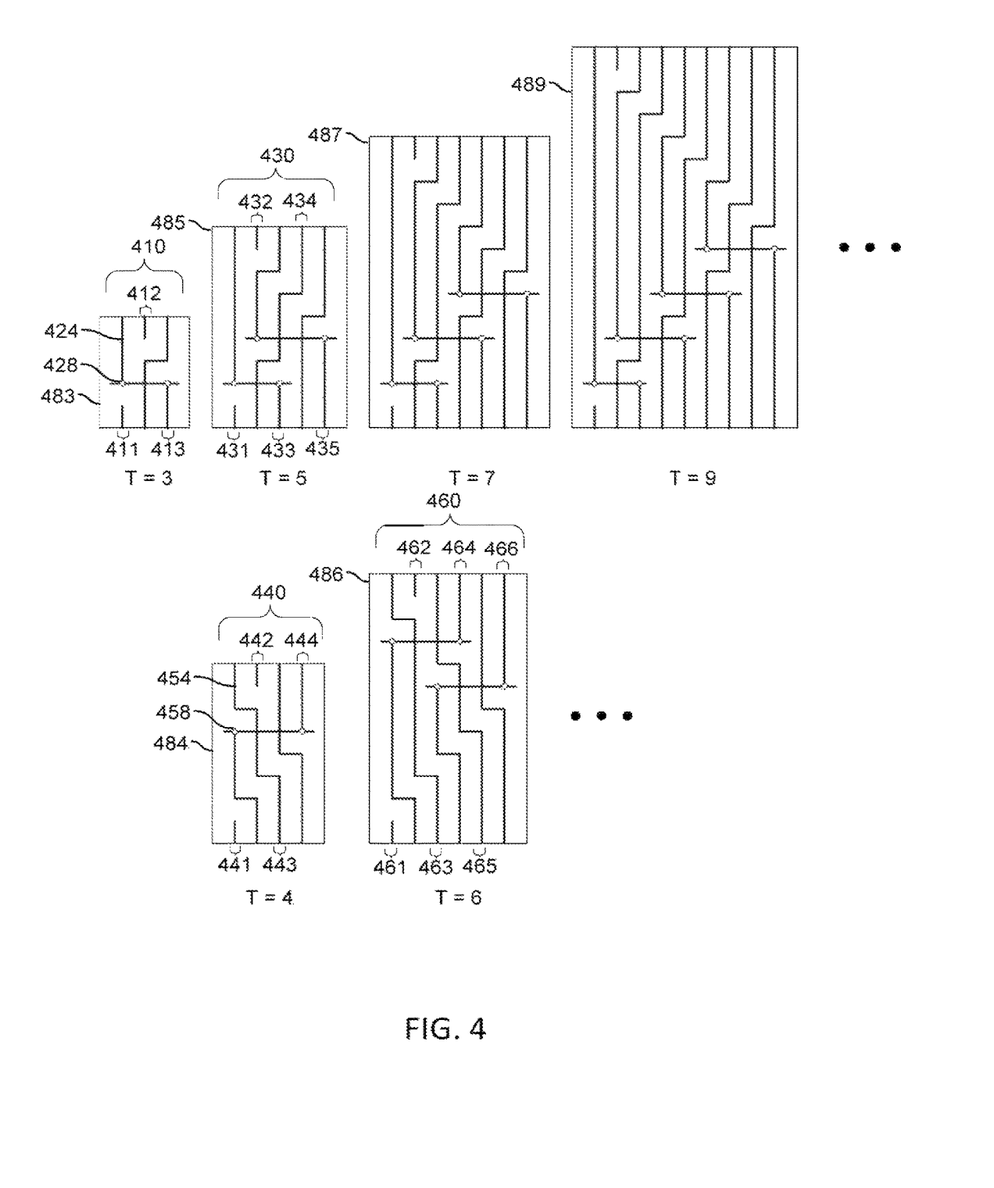
FIG. 4 is a diagram of illustrative routing tiles having different number of tracks and arranged according to the template of FIG. 3 such that each pair of adjacent wires overlaps each other for at most one tile length when arranged in a sequence of routing tiles in accordance with an embodiment.

The wire that enters routing tile 310 on the track with the highest even number (i.e., track Track4) exits routing tile 310 one track to the right when the total number of tracks is odd (e.g., see T=3, T=5, and T=7 in FIG. 4). In other words, the wire that enters routing tile 310 on track Track4 exits routing tile 310 on track Track5. In the event that the routing tile has an even number of tracks (e.g., see T=4 and T=6 in FIG. 4), the wire that enters routing tile 310 on the track with the highest even number exits routing tile 310 one track to the left (not shown).

A route of a wire from one track to another track may use via connections and a different metal layer than the metal layer in which the wire enters and exits routing tile 310.

The description and representation of routing tile 310 as a unidirectional, bottom to top, vertical routing channel (i.e., wires enter a tile on the bottom and exit a tile on the top) with five tracks and wires of length five is not intended to limit the scope of the present invention. If desired, interconnect circuit 310 may be bidirectional or unidirectional from top to bottom and run along any axis in the integrated circuit.

If desired, routing tile 310 may be rotated along any axis of symmetry, while keeping the desired properties of regularity and reduced overlap between any pair of adjacent wires. As a result, a unidirectional wire that enters the routing tile on the bottom and exits the routing tile on the top may enter the routing tile on the top and exit the routing tile on the bottom if the routing tile is reflected across a horizontal axis, enter the routing tile on the right and exit the routing tile on the left if the routing tile is rotated counterclockwise by 90 degrees, or enter the routing tile on the left and exit the routing tile on the right if the routing tile is rotated clockwise by 90 degrees.

Similarly, a wire that shifts to the right may shift to the left if the routing tile is reflected across a vertical axis, shift upwards if the routing tile is rotated counterclockwise by 90 degrees, or shift downwards if the routing tile is rotated clockwise by 90 degrees. Interconnect circuit 310 may further include wires of arbitrary length and have any arbitrary number of tracks.

If desired, routing tile 310 may be instantiated multiple times. The multiple instantiations of routing tile 310 may be coupled in a chain, thereby forming a routing channel in which each routing tile has the exact same layout.

FIG. 4 shows illustrative routing tiles with odd track numbers (e.g., three, five, seven, nine, etc. tracks T) and even track numbers (e.g., four, six, etc. tracks T). Each routing tile is arranged according to the template of FIG. 3 such that any pair of adjacent wires overlaps each other for at most one tile length when arranged in a sequence of routing tiles.

Similar to routing tile 310 of FIG. 3, the routing tiles of FIG. 4 are shown and described as a unidirectional, bottom to top, vertical routing channel (i.e., wires enter a tile on the bottom and exit a tile on the top), which is not intended to limit the scope of the present invention. If desired, the routing tiles of FIG. 4 may be bidirectional or unidirectional from top to bottom and run along any axis in the integrated circuit. For example, the routing tiles may be rotated along any axis of symmetry, while keeping the desired properties of regularity and reduced overlap between any pair of adjacent wires.

As a result, a unidirectional wire that enters the routing tile on the bottom and exits the routing tile on the top may enter the routing tile on the top and exit the routing tile on the bottom if the routing tile is reflected across a horizontal axis, enter the routing tile on the right and exit the routing tile on the left if the routing tile is rotated counterclockwise by 90 degrees, or enter the routing tile on the left and exit the routing tile on the right if the routing tile is rotated clockwise by 90 degrees.

Similarly, a wire that shifts to the right may shift to the left if the routing tile is reflected across a vertical axis, shift upwards if the routing tile is rotated counterclockwise by 90 degrees, or shift downwards if the routing tile is rotated clockwise by 90 degrees.

The twists in the routing tiles of FIG. 4 are shown to have a 90 degree angle relative to the tracks. In fact, the twists may have any angle that allows the wire to switch from one track to another track. For example, the twists may have an angle of 30 degrees, 45 degrees, 60 degrees, 75 degrees, 135 degrees, 225 degrees, 315 degrees, just to name a few. An allowable range for the twist angle may be determined by several factors including design rules and optimization criteria such as minimal area use.

As shown, each routing tile may have a wire that starts in the second track from the left (e.g., in tracks 412, 432, 442, and 462 for routing tiles 483, 485, 484, and 486, respectively) and another wire that ends in the leftmost track (e.g., in tracks 411, 431, 441, and 461 for routing tiles 483, 485, 484, and 486, respectively).

Wires that enter a routing tile on tracks with odd numbers and that don't end in that track (i.e., wires on track 413 for routing tile 483, on tracks 433 and 435 for routing tile 485, on track 443 for routing tile 484, on tracks 463 and 465 for routing tile 486, etc.) exit the respective routing tile two tracks to the left. In other words, the wire that enters routing tile 483 on track 413 exits routing tile 483 on track 411, the wires that enter routing tile 485 on tracks 433 and 435 exit routing tile 485 on tracks 431 and 433, respectively, the wire that enters routing tile 484 on track 443 exits routing tile 484 on track 441, and the wires that enter routing tile 486 on tracks 463 and 465 exit routing tile 486 on tracks 461 and 463, respectively, etc.

Wires that enter a routing tile on tracks with even numbers except for the track with the highest even number (i.e., wires on tracks 432, 442, 462, and 464, but not wires on tracks 412, 434, 444, and 466) exit the routing tile two tracks to the right. In other words, the wire that enters routing tile 485 on track 432 exits the routing tile on track 434, the wire that enters routing tile 484 on track 442 exits the routing tile on track 444, and the wires that enter routing tile 486 on tracks 462 and 464 exit the routing tile on tracks 464 and 466, respectively, etc.

The wire that enters a routing tile on the track with the highest even number exits the routing tile one track to the right when the total number of tracks is odd (e.g., routing tiles 483, 485, and 487). In other words, the wire that enters routing tile 483 on track 412 exits the routing tile on track 413, and the wire that enters routing tile 485 on track 434 exits the routing tile on track 435. In the event that the routing tile has an even number of tracks (e.g., routing tiles 484 and 486), the wire that enters the routing tile on the track with the highest even number exits the routing tile one track to the left. In other words, the wire that enters routing tile 484 on track 444 exits the routing tile on track 443, and the wire that enters routing tile 486 on track 466 exits the routing tile on track 465.

As shown, routing tiles with an odd number of tracks (i.e., routing tiles 483, 485, 487, 489, etc.) may implement routes from one track to another track on its right by twisting the wire in the same metal layer, while routes to another track on its left may be implemented using via connections (e.g., via connection 428 in routing tile 483) and a wire in another metal layer.

With the exception of the wire leaving the routing tile on the leftmost track, the routing tiles with an odd number of tracks may further twist wires after a route through a via connection one track to the right. For example, the wire that enters routing tile 485 on track 435 may connect to track 432 by traversing a first via connection, a wire in another metal layer, and a second via connection. The wire may then be twisted from track 432 to track 433 on which the wire may exit routing tile 485.

Routing tiles with an odd number of T tracks (i.e., routing tiles 483, 485, 487, 489, etc.) may require T-1 via connections and one wire in another metal layer connecting each pair of via connections.

As shown, routing tiles with an even number of tracks (i.e., routing tiles 484, 486, etc.) may implement routes from one track to another track on its left by twisting the wire in the same metal layer, while routes to another track on its right may be implemented using via connections (e.g., via connection 458 in routing tile 484) and a wire in another metal layer.

The routing tiles with an even number of tracks may further twist wires before a route through a via connection one track to the left. For example, the wire that enters routing tile 486 on track 464 may be twisted to track 463 before connecting to track 466 by traversing a first via connection, a wire in another metal layer, and a second via connection. The wire may exit routing tile 486 on track 466.

Routing tiles with an even number of T tracks (i.e., routing tiles 484, 486, etc.) may require T-2 via connections and one wire in another metal layer connecting each pair of via connections.

Several instances of the routing tiles shown in FIG. 4 may be arranged in a sequence of routing tiles in which each routing tile has the same layout to form an interconnect circuit. Such an interconnect circuit with a sequence of routing tiles 484 is shown as interconnect circuit 510 in FIG. 5.

Figure 5:
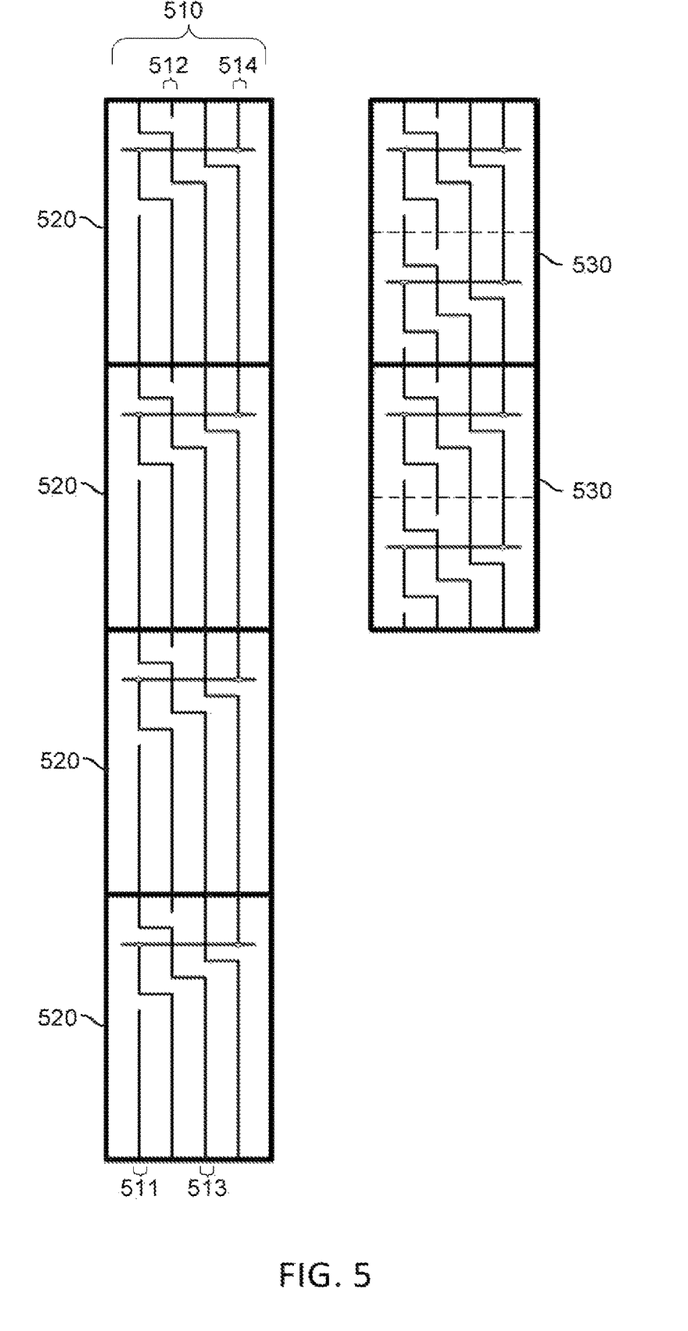
FIG. 5 is a diagram showing an illustrative sequence of tiles with a beginning and an ending wire overlapping each other on adjacent tracks to provide for beneficial crosstalk in suboptimal wire stitching configurations in accordance with an embodiment.

For example, interconnect circuit 510 may include four instances of routing tile 520, which may be coupled in a sequence of routing tiles. A wire that starts in track 512 in a first routing tile may enter the second routing tile in track 512 and exit the second routing tile in track 514. The wire may enter the third routing tile in track 514, exit the third routing tile in track 513, enter the fourth routing tile in track 513, exit the fourth routing tile in track 511, and end in the fifth routing tile in track 511.

As shown, any pair of adjacent wires in interconnect circuit 510 may spatially overlap each other for one routing tile. The spatial overlap may be further reduced by implementing multiple instances of routing tile 520 inside a single routing tile. For example, each routing tile 530 includes two instances of routing tile 520, thereby providing two starting wires and two ending wires per routing tile and reducing the spatial overlap to half a routing tile.

If desired, routing tiles 520 may enable beneficial crosstalk in the event that wires are stitched together to form longer wires. As an example consider stitching the wire that enters routing tile 520 on the bottom of interconnect circuit 510 on track 513 with the wire that starts in track 512 of that same routing tile. In this example, the two wires overlap each other on adjacent tracks 511 and 512 from the end of routing tile 520 on the bottom of interconnect circuit 520 to the end of the wire in track 511 in the second routing tile 520 from the bottom. The signals in both wires may toggle in the same direction, thereby providing for beneficial crosstalk.

Figure 6:
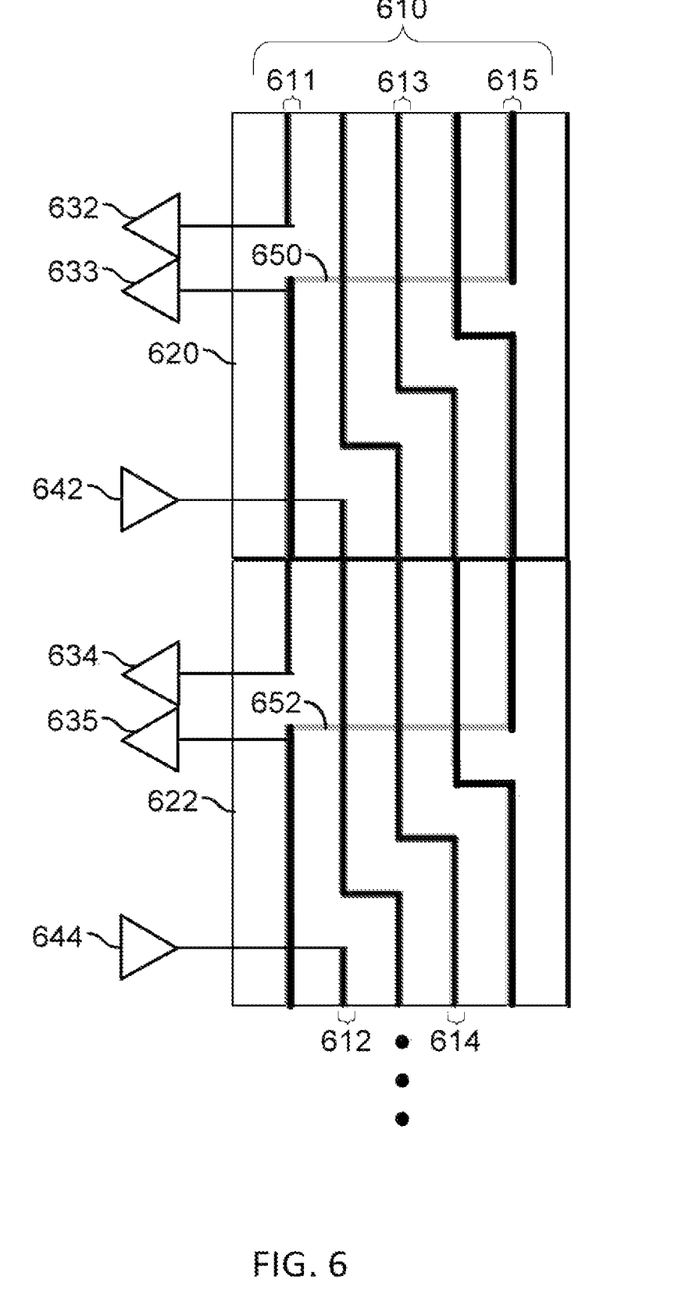
FIG. 6 is a diagram showing an illustrative sequence of two routing tiles with wire access that enables suboptimal wire stitching and provides for beneficial crosstalk in accordance with an embodiment.

FIG. 6 shows an illustrative diagram of two routing tiles with wire access that enables suboptimal wire stitching and provides for beneficial crosstalk.

Similar to interconnect circuit 310 of FIG. 3, interconnect circuit 610 is shown and described as a unidirectional, top to bottom, vertical routing channel (i.e., wires enter a tile on the top and exit a tile on the bottom) with five tracks, which is not intended to limit the scope of the present invention. If desired, interconnect circuit 610 may be bidirectional or unidirectional from bottom to top and run along any axis in the integrated circuit.

The twists in interconnect circuit 610 are shown to have a 90 degree angle relative to the tracks. In fact, the twists may have any angle that allows the wire to switch from one track to another track. An allowable range for the twist angle may be determined by several factors including design rules and optimization criteria such as minimal area use.

As shown in FIG. 6, interconnect circuitry 610 with routing tiles 620, 622, etc. may include tracks 611, 612, 613, 614, and 615. Each routing tile (e.g., routing tiles 620, 622, etc.) may have a wire that starts in track 612 and a wire that ends in track 611. Each routing tile may further have twists from one track to a neighboring track and a connection between two tracks through two via connections and a wire 650 in another metal layer. Thus, any pair of adjacent wires of length L spatially overlap each other for at most L-2 routing tiles in interconnect circuitry 610.

Drivers 642, 644, etc. may drive signals on the wires that start on track 612 of routing tiles 620, 622, etc., and drivers 632, 633, 634, 635, etc. may access signals from wires on track 611.

As an example, consider the scenario in which each wire has a length L of five (i.e., L=5) and a signal is required to propagate through nine routing tiles. In this example, two wires of length L=5 may be stitched together to form a wire that spans the nine routing tiles.

For example, the signal may enter routing tile 622 on track 611 after traversing five routing tiles. Driver 634 may access the signal and external circuitry (not shown) may connect driver 634 to driver 644 from which the signal may access the wire on track 612 of routing tile 622 and travers an additional four routing tiles, thereby traversing a total of nine routing tiles.

Alternatively, if desired, the signal may enter routing tile 620 on track 615 after traversing four routing tiles. The signal may be routed from track 615 through two via connections (not shown) and wire 650 in another metal layer to driver 633. Driver 633 may access the signal, and external circuitry (not shown) may connect driver 633 to driver 642 from which the signal may access the wire on track 612 of routing tile 620. The signal may then traverse an additional five routing tiles, thereby traversing a total of nine routing tiles. The configuration in which a first wire is stitched to a second wire before the end of the first wire is sometimes also referred to as sub-optimal stitching.

The wire ending on track 611 in routing tile 622 and the wire starting on track 612 in routing tile 620 spatially overlap each ether on adjacent tracks. In the case of suboptimal stitching in routing tile 620, both wires (i.e., the wire ending in routing tile 622 and the wire starting in routing tile 620) toggle in the same direction and may thus enable beneficial crosstalk.

As another example, consider the scenario in which each wire has a length L=5 and a signal is required to traverse 20 routing tiles. Using interconnect circuitry 610, four wires of length L=5 may be stitched together optimally (i.e., the end of each wire is connected to the start of the next wire) to produce a connection that stretches 20 routing tiles. Alternatively, five wires of length L=5 may be stitched together sub-optimally (i.e., one routing tile before the end of the wire) to produce a connection that stretches 20 routing tiles and that may enable beneficial crosstalk at each stitching connection.

Figure 7:
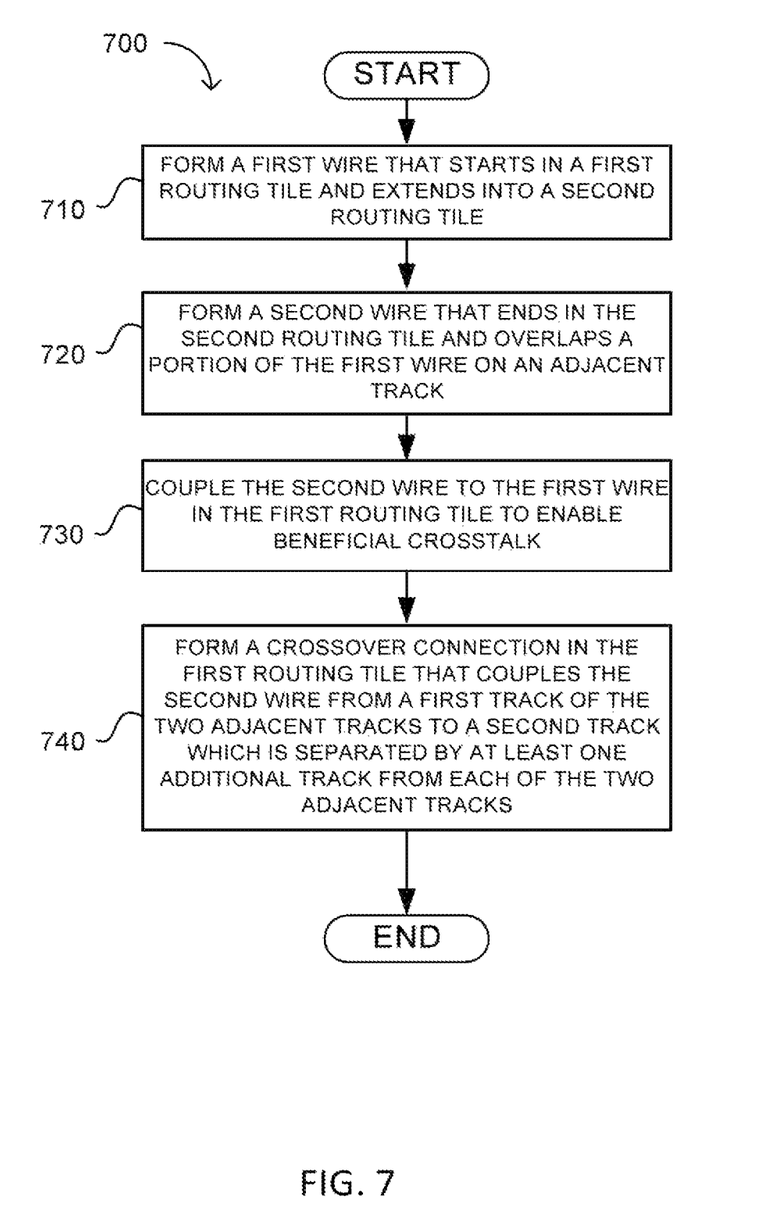
FIG. 7 is a flow chart showing illustrative steps for forming an interconnect circuit with a sequence of tiles that have a beginning and an ending wire overlapping each other on adjacent tracks to provide for beneficial crosstalk in suboptimal wire stitching configurations in accordance with an embodiment.

FIG. 7 is a flow chart showing illustrative steps for forming an interconnect circuit such as interconnect circuitry 610 with a sequence of tiles (e.g., routing tiles 620 and 622) that have a beginning and an ending wire overlapping each other on adjacent tracks to provide for beneficial crosstalk in sub-optimal wire stitching configurations.

During step 710, a first wire that starts in a first routing tile and extends into a second routing tile may be formed. A second wire that ends in the second routing tile and overlaps a portion of the first wire on an adjacent track may be formed during step 720.

During step 730, the second wire may be coupled to the first wire in the first routing tile to enable beneficial crosstalk. During step 740, a crossover connection may be formed in the first routing tile. The crossover connection may couple the second wire from a first track of the two adjacent tracks to a second track which is separated from each of the two adjacent tracks by at least one additional track.

For example, wire connection 650 of FIG. 6 together with two via connections may form the crossover connection between tracks 611 and 612, thereby separating both tracks 611 and 612 from track 615 by two additional tracks 613 and 614. The crossover connection together with the spatial overlap of the ending wire with the starting wire may limit the overlap of any pair of wires of length L to L-2.

Figure 8:
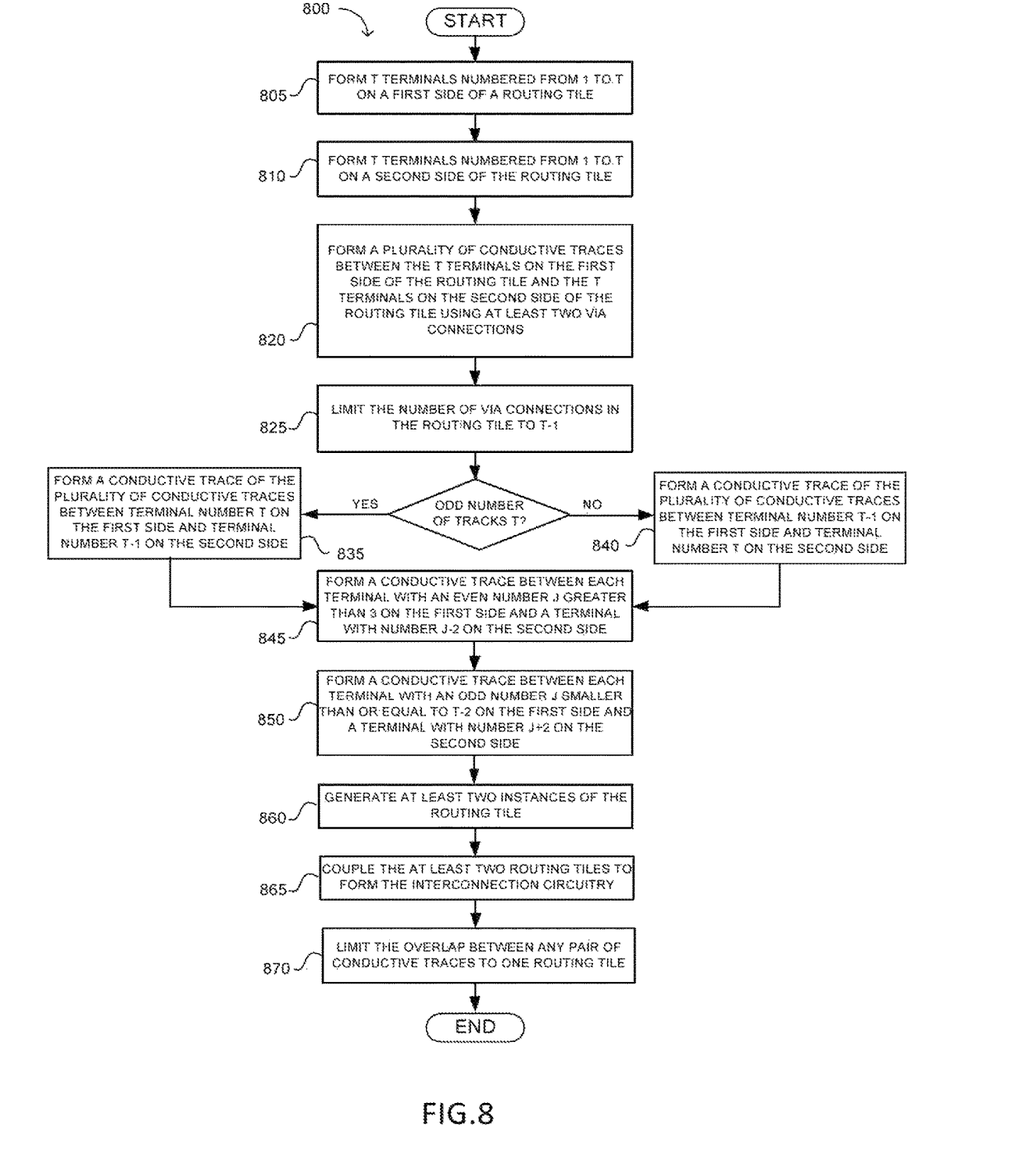
FIG. 8 is a flow chart showing illustrative steps for generating a routing tile with each pair of adjacent wires overlapping each other for at most one tile length when arranged in a sequence of routing tiles in accordance with an embodiment.

A further reduction in spatial overlap between any pair of adjacent wires to a single routing tile may be achieved by forming an interconnect circuit from a sequence of routing tiles according to the template presented in FIG. 3. FIG. 8 is a flow chart showing illustrative steps for generating such a routing tile.

During step 805, T terminals numbered from one to T may be formed on a first side of a routing tile, and T terminals numbered from one to T may be formed on a second side of the routing tile during step 810. During step 820, a plurality of conductive traces between the T terminals on the first side and the T terminals on the second side of the routing tile may be formed using at least two via connections, with the number of via connections in the routing tile limited to T-1 during step 825.

In the event that the routing tile includes an odd number of T tracks, a conductive trace of the plurality of conductive traces may be formed between terminal number T on the first side and terminal number T-1 on the second side of the routing tile during step 835. However, in the event that the routing tile includes an even number of T tracks, a conductive trace of the plurality of conductive traces may be formed between terminal number T-1 on the first side and terminal number T on the second side of the routing tile during step 840.

During step 845, a conductive trace may be formed between each terminal with an even number J greater than three on the first side that is not yet connected and a terminal with number J-2 on the second side. During step 850, a conductive trace may be formed between each terminal with an odd number J smaller than or equal to T-2 on the first side that is not connected yet and a terminal with number J+2 on the second side.

During step 860, at least two instances of the routing tile may be generated. The at least two tiles may be coupled during step 865 to form the interconnect circuitry. The resulting interconnect circuitry may limit the overlap between any pair of conductive traces to one routing tile during step 870.

The method and apparatus described herein may be incorporated into any suitable electronic device or system of electronic devices. For example, the method and apparatus may be incorporated into numerous types of devices such as microprocessors or other ICs. Exemplary ICs include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), digital signal processors (DSPs), graphics processing units (GPUs), just to name a few.

The integrated circuit described herein may be part of a data processing system that includes one or more of the following components; a processor; memory; I/O circuitry; and peripheral devices. The integrated circuit can be used in a wide variety of applications, such as computer networking, data networking, instrumentation, video processing, digital signal processing, or any suitable other application where the advantage of using interface circuitry with reduced spatial overlap between adjacent wires and enablement of beneficial crosstalk is desirable.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. Interconnect circuitry, comprising:
   a routing tile in a sequence of tiles, wherein the routing tile comprises:
   a first wire in a first metal layer that has a first endpoint in a first track;
   a second wire in the first metal layer that has a second endpoint in a second track that is different than the first track;
   a third wire in the first metal layer that has a third endpoint in a third track that is different than the first and second tracks;
   a fourth wire in the first metal layer that runs along the first track; and
   a connection from the third wire to the fourth wire through at least two via connections and a track in a second metal layer.

2. The interconnect circuitry of claim 1, wherein each routing tile in the sequence of tiles has the same layout.

3. The interconnect circuitry of claim 1, wherein the routing tile further comprises:
   a fifth wire in the first metal layer that is routed from the second track to the third track and from the third track to a fourth track.

4. The interconnect circuitry of claim 3, wherein the routing tile further comprises:
   a sixth wire in the first metal layer that is routed from the fourth track to a fifth track.

5. The interconnect circuitry of claim 4, wherein the routing tile further comprises:
   a seventh wire in the first metal layer that has a fourth endpoint in the fifth track; and
   an eighth wire in the first metal layer that has a fifth endpoint in the second track.

6. The interconnect circuitry of claim 5, wherein the routing tile further comprises:
   an additional connection from the seventh wire to the eighth wire through at least two additional via connections and an additional track in the second metal layer.

7. The interconnect circuitry of claim 1, wherein the routing tile further comprises:
   a fifth wire in the first metal layer that is routed from a fourth track to the third track.

8. The interconnect circuitry of claim 7, wherein the routing tile further comprises:
   a sixth wire in the first metal layer that is routed from the first track to the second track and from the second track to the fourth track.

9. A method for arranging wires in interconnection circuitry on an integrated circuit, comprising:
   forming a first wire that starts in a first routing tile and extends into a second routing tile;
   forming a second wire that starts in the first routing tile and that ends in the second routing tile, wherein the first and second wires overlap each other on two adjacent tracks from at least a portion of the first routing tile to at least a portion of the second routing tile, and wherein the first and second wires have different starting points; and
   coupling the second wire to the first wire in the first routing tile, wherein coupling the second wire to the first wire comprises:
   forming a first driver that receives a signal from the second wire in the first routing tile; and
   forming a second driver that drives the signal onto the first wire in the first routing tile.

10. The method of claim 9, wherein the first and second routing tiles are adjacent.

11. The method of claim 9, further comprising:
    configuring routing circuitry that routes the signal from the first driver to the second driver.

12. The method of claim 9, further comprising:
    forming a crossover connection in the first routing tile, wherein the crossover connection couples the second wire from a first track of the two adjacent tracks to a second track, and wherein the second track is separated by at least one additional track from each of the two adjacent tracks.

13. The method of claim 12, wherein forming the crossover connection further comprises:
    forming a first via connection between the first track in a first metal layer and an additional track in a second metal layer;
    forming a second via connection between the second track in the first metal layer and the additional track in the second metal layer; and forming a wire connection in the additional track in the second metal layer between the first and second via connections.

14. A method for forming a routing tile with T tracks, comprising:
   forming T terminals numbered from 1 to T on a first edge of the routing tile;
   forming T terminals numbered from 1 to T on a second edge of the routing tile that opposes the first edge; and
   forming a plurality of conductive traces between the T terminals on the first edge of the routing tile and the T terminals on the second edge of the routing tile, wherein at least one conductive trace of the plurality of conductive traces includes at least two via connections that link together nonadjacent terminals on the first and second edges of the routing tile.

15. The method of claim 14, wherein the routing tile has at most (T-1) via connections.

16. The method of claim 14, wherein forming the plurality of conductive traces further comprises:
   determining whether T is an odd number.

17. The method of claim 16, further comprising:
   in response to determining that T is an odd number, forming a conductive trace in the plurality of conductive traces between terminal number T on the first edge and terminal number T-1 on the second edge.

18. The method of claim 16, further comprising:
   in response to determining that T is not an odd number, forming a conductive trace in the plurality of conductive traces between terminal number T-1 on the first edge and terminal number T on the second edge.

19. The method of claim 14, wherein forming the plurality of conductive traces further comprises:
   forming an additional conductive trace in the plurality of conductive traces for each terminal with an even number i greater than three on the first edge and a terminal with number i-2 on the second edge.

20. The method of claim 14, wherein forming the plurality of conductive traces further comprises:
   forming an additional conductive trace for each terminal with an odd number i smaller than T on the first edge and a terminal with number i+2 on the second edge.

21. The method of claim 14, further comprising:
   generating at least two instances of the routing tile; and
   coupling the at least two instances of the routing tile to form the interconnection circuitry.

22. The method of claim 21, wherein any pair of conductive traces of the plurality of conductive traces is adjacent for at most one instance of the routing tile.

* * * * *